United States Patent
Yu

(10) Patent No.: US 6,572,383 B1
(45) Date of Patent: Jun. 3, 2003

(54) PICK-UP CAP FOR A CPU SOCKET

(75) Inventor: Wei Yu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/060,119

(22) Filed: Jan. 28, 2002

(51) Int. Cl.[7] .............................................. H01R 13/60
(52) U.S. Cl. ........................................ 439/41; 439/940
(58) Field of Search ........................... 439/41, 940, 135, 439/342

(56) References Cited

U.S. PATENT DOCUMENTS

| | | | |
|---|---|---|---|
| 5,833,483 A | * 11/1998 | Lai et al. | 439/342 |
| 5,910,023 A | * 6/1999 | McHugh et al. | 439/41 |
| 6,155,848 A | * 12/2000 | Lin | 439/135 |
| 6,383,007 B1 | * 5/2002 | Lin et al. | 439/342 |
| 6,413,111 B1 | * 7/2002 | Pickles et al. | 439/342 |
| 6,439,901 B1 | * 8/2002 | Ji et al. | 439/135 |
| 6,439,913 B1 | * 8/2002 | Ma | 439/342 |
| 6,478,588 B1 | * 11/2002 | Howell et al. | 439/135 |

* cited by examiner

Primary Examiner—Tulsidas Patel
(74) Attorney, Agent, or Firm—Wei Te Chung

(57) ABSTRACT

A pick-up cap (2) for a CPU socket (1) is provided. The socket includes a base (12) and a cover (11) slidably stacked on the base to be movable between an open position and a closed position. The cover and the base respectively have first and second openings (112) and (121) completely overlapped with each other in the opening position and partially overlapped in the closed position. The pick-up cap has a flat top surface (21) and a bottom surface (22), and a corresponding number of legs (23) projecting downwardly from the bottom surface. Each leg comprises a connecting arm (231) received in the first opening and a hook (232) bent at a free end of the arm and received in the second opening.

5 Claims, 5 Drawing Sheets

PICK-UP CAP FOR A CPU SOCKET

BACKGROUND OF THE INVENTION

1. Field of the Invention

The present invention relates to the art of electrical connectors, and more particularly to a pick-up cap for use in a central processing unit (CPU) socket to facilitate operation.

2. Description of the Related Art

In order to accurately position a CPU socket on a printed circuit board (PCB), the CPU socket is carried to the PCB by a vacuum device which sucks a pick-up cap connected with the CPU socket. As can be seen from FIGS. 6 and 7, a pick-up cap 4 has an upper surface 40 and a bottom surface 41, and a plurality of legs 42 projecting downwardly from the bottom surface 41. The hooks 42 are fit in corresponding openings 311 of a cover 31 of a CPU socket 3 and engaged with a stopping face 312 defined in the opening 311 thereby securing the pick-up cap 4 on the CPU socket 3. Consequently, the CPU socket 3 is carried by a vacuum device (not shown) sucking the top surface 40 of the pick-up cap 4 and is accuratedly located on the PCB.

However, the hook 42 has to be bent laterally to escape the stopping plane 312 during its downwardly engaging process. If deformation of the hook 42 is too great, it will break off from its weakest point, thereby leading to failure of the pick-up cap 4 to connect with the CPU socket 3. The copending application Ser. No. 09/909,584 having the same assignee with the invention, discloses a pick-up cap to be engaged with and disengaged from the moveable cover when the cover is in different positions. Anyhow, this style socket and cap are used for a relative large dimension design where the hooks are substantially surrounding the contact area thereof. For the relatively small dimension design as shown in FIGS. 6 and 7, such an arrangement can not fit thereto because there is no available space on the outer sides of the contact areas for disposing such hooks. Thus, a new pick-up cap design having the similar advantage of the aforementioned copending Ser. No. 09/909,584 application while being used for the small sized socket as shown in FIGS. 6 and 7, is earnestly desired. Moreover, another disadvantage of the design shown in FIGS. 6 and 7, is A that the available suction area is relatively limited because of the latch positions (referring to the copending application Ser. No. 10/040,533 with the same assignee as the invention).

SUMMARY OF THE INVENTION

An object of the present invention is to provide a CPU socket assembly with an improved-pick-up cap having a retention mechanism which can be easily and reliably assembled to the CPU socket.

Another object of the present invention is to provide a method for mounting a CPU socket on a PCB through a vacuum device and a pick-up cap.

In order to achieve the objects set forth, a pick-up cap in accordance with present invention for assembled to a CPU socket is provided. The socket includes a base and a cover slidably stacked on the base to movable between an open position and a closed position. The base and the cover both has openings defined thereof, such openings are completely overlapped with each other at the open position and are partially overlapped with each other at the closed position. The pick-up cap has a flat top surface and a bottom surface, and a corresponding number of legs projecting downwardly from the bottom surface. Each leg forms a hook at a free end thereof.

In assembly, the openings of the cover are firstly overlapped the openings of the base completely, then the hooks of the legs are freely inserted through the openings of the cover and reaches the openings of the base. Subsequently, the cover slides laterally with regard to the base to make the openings of the cover partially overlap the openings of the base, so that the openings of the cover engage with the hooks of the legs. Finally, a vacuum device (not shown) sucks the top surface of the pick-up cap to mount the socket at a predetermined position on a PCB.

DESCRIPTION OF THE PREFERRED EMBODIMENT

Reference will now be made in detail to the preferred embodiment of the present invention.

Figure 1:
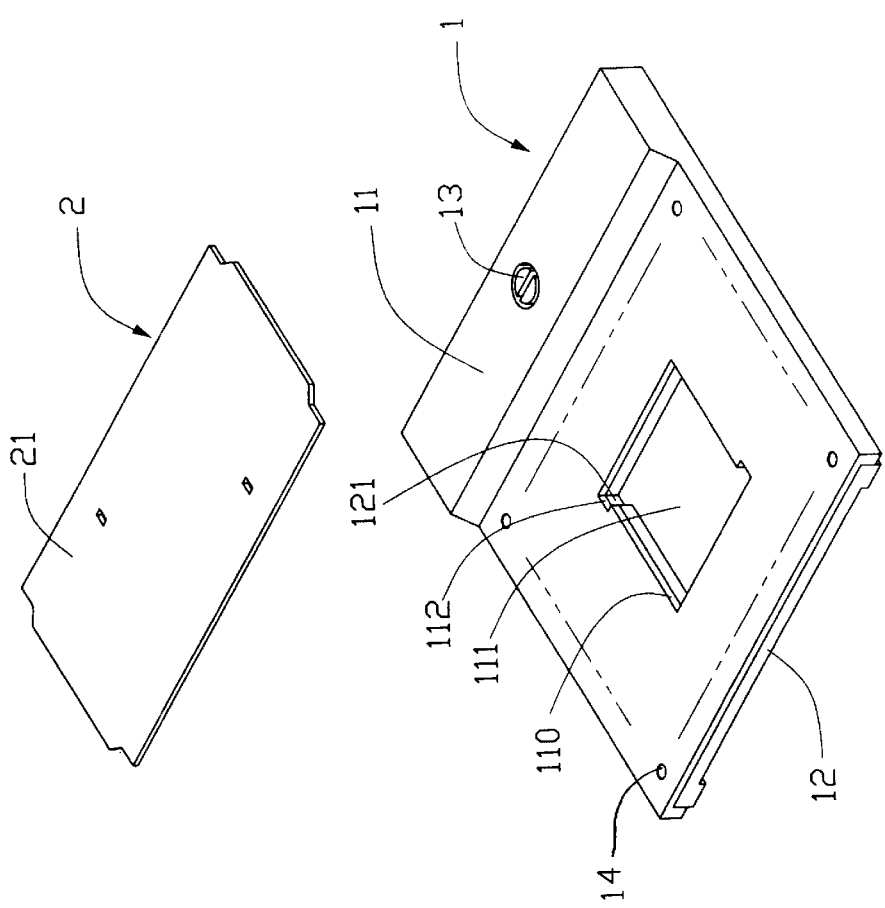
FIG. 1 is a perspective view of a pick-up cap in accordance with the present invention together with a CPU socket.

Referring to FIG. 1, a pick-up cap 2 of the present invention is used to mount on a CPU socket 1 by a vacuum device (not shown). In use, the CPU socket needs to be placed on a predetermined position of a PCB to establish electrical connection therebetween.

Figure 2:
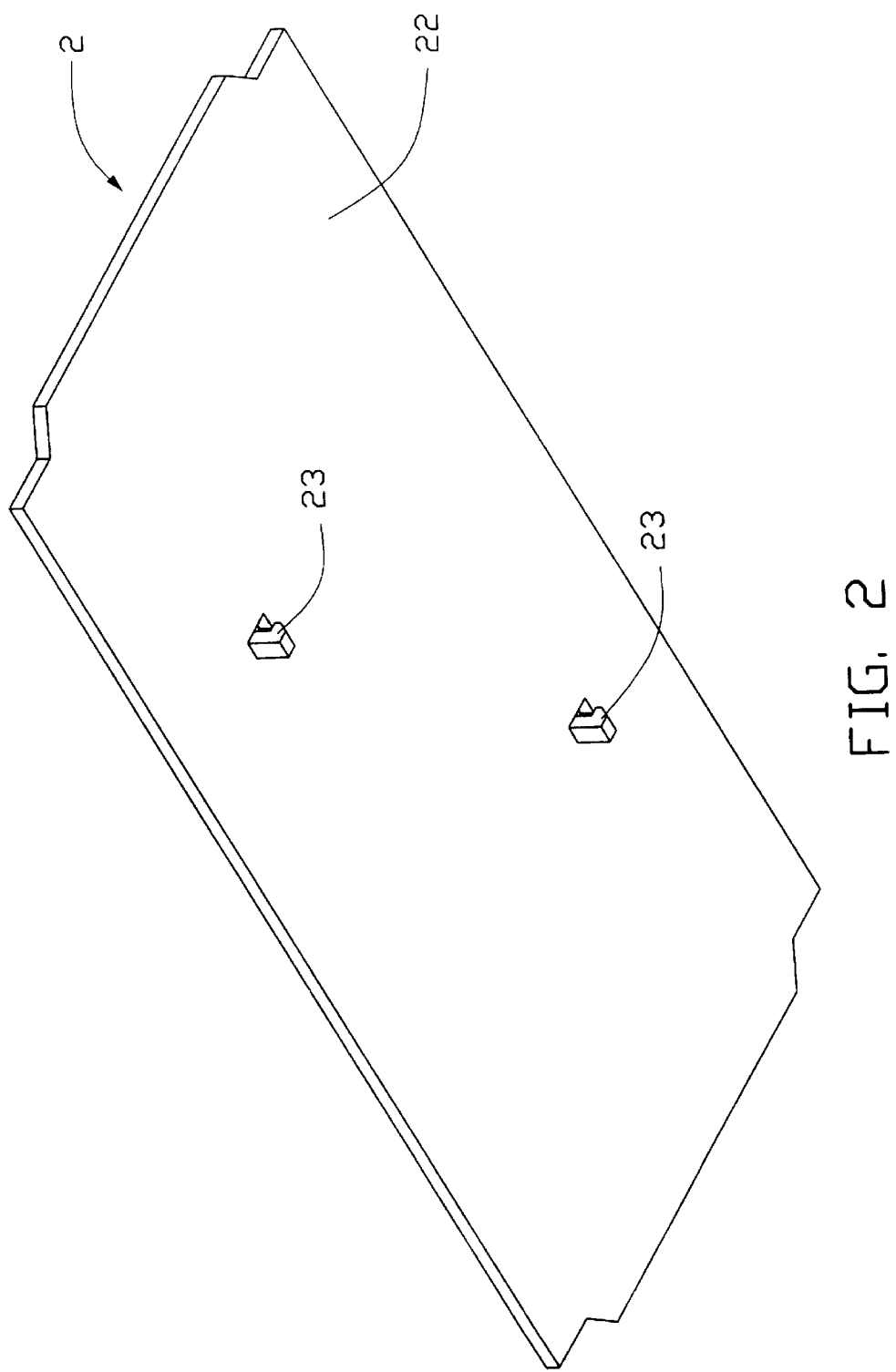
FIG. 2 is another perspective view of the pick-up cap of FIG. 1.

The socket 1 includes a base 12, a cover 11 movably stacked on the base 12, and a driving cam 13 defined at rear ends of the base 12 and the cover 11 for driving the cover 11 to slide laterally between an open position and a closed position. The base 12 and the cover 11 both form a central opening 111 surrounded by contact area (not shown) of the base 12. The cover 11 defines a plurality of through holes 14, for receiving the corresponding CPU pins, in alignment with the contacts (not shown) disposed the contact area (not shown) of the base 12. A pair of second openings 121 is concaved at opposite sides of the opening 111 of the base 12 and a pair of first openings 112 is concaved at opposite sides of the opening 111 of the cover 11. the openings 121 of the base 12 and the openings 112 of the cover 11 have a same dimension and are completely overlapped in a vertical direction when the socket 1 is in an open position. Referring to FIG. 2, The pick-up cap 2 defines a flat top surface 21 for vacuum suction, and a bottom surface 22 for mounting on the cover 11 of the socket 1. a pair of legs 23 projects downwardly from the bottom surface 22 for receiving in corresponding openings 112 and 121. Each leg 23 includes a connecting arm 231 extending from the bottom surface 22 and a hook 232 bent vertically from a free end of the connecting arm 32.

Figure 3:
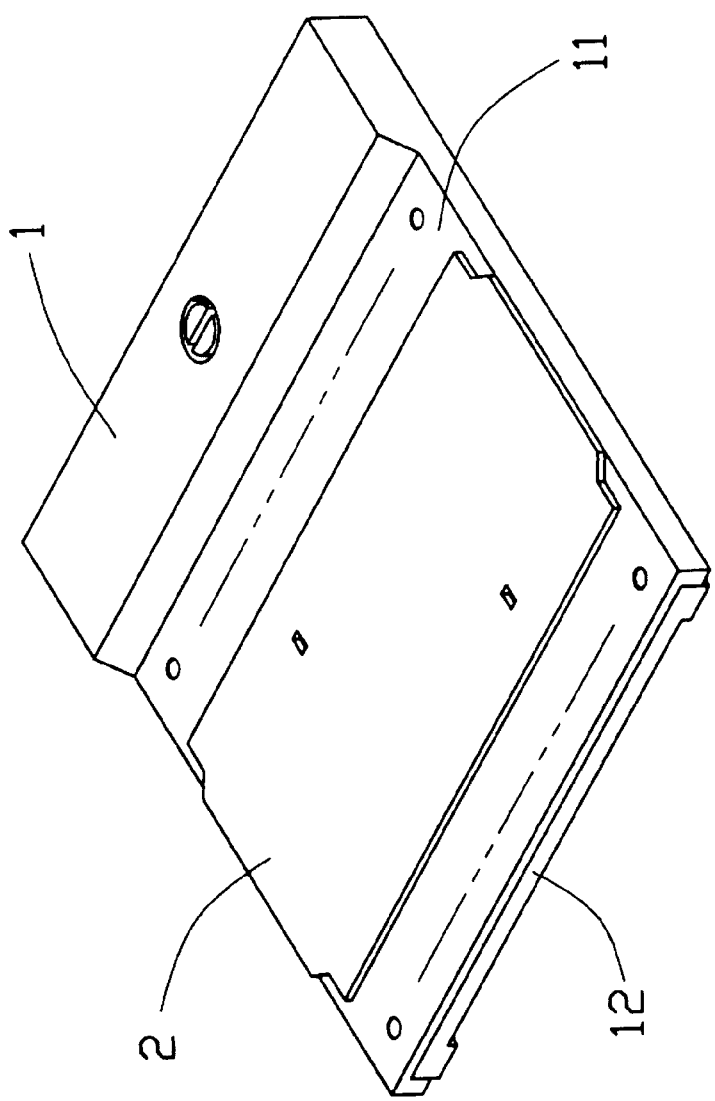
FIG. 3 is an assembled view of the pick-up cap and the CPU socket of FIG. 1.
Figure 4:
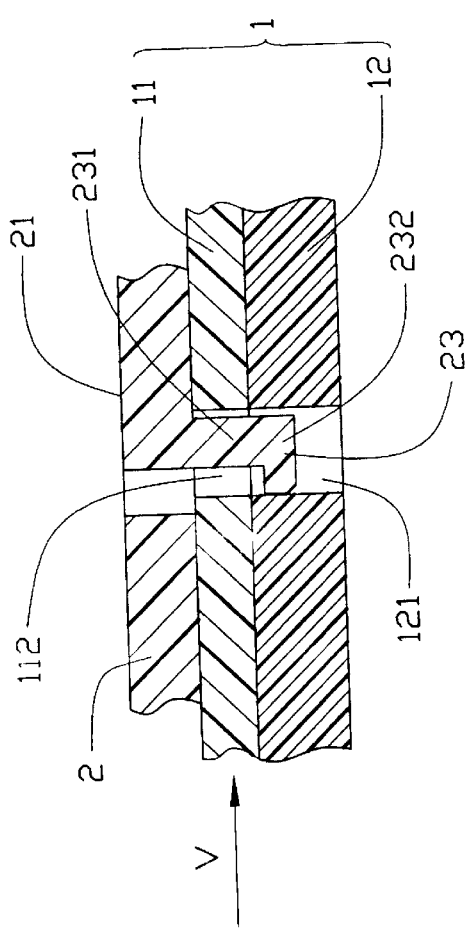
FIGS. 4 and 5 are partially cross-sectional views of the pick-up cap and the CPU socket of FIG. 3, showing positional relationship of the cap and the socket.
Figure 5:
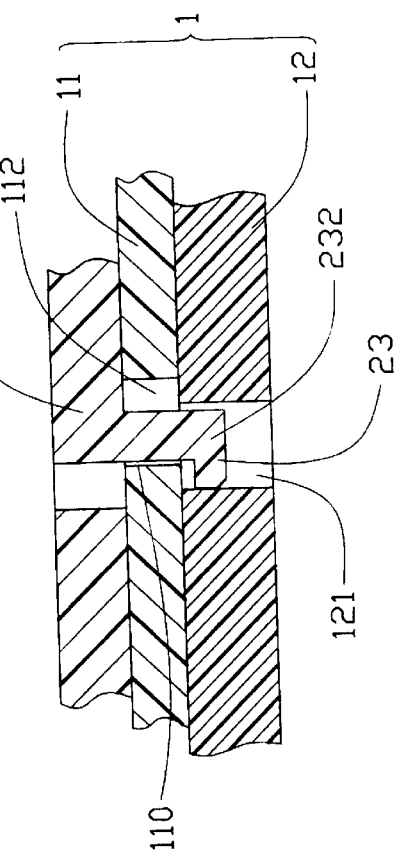
Figures 6, 7:
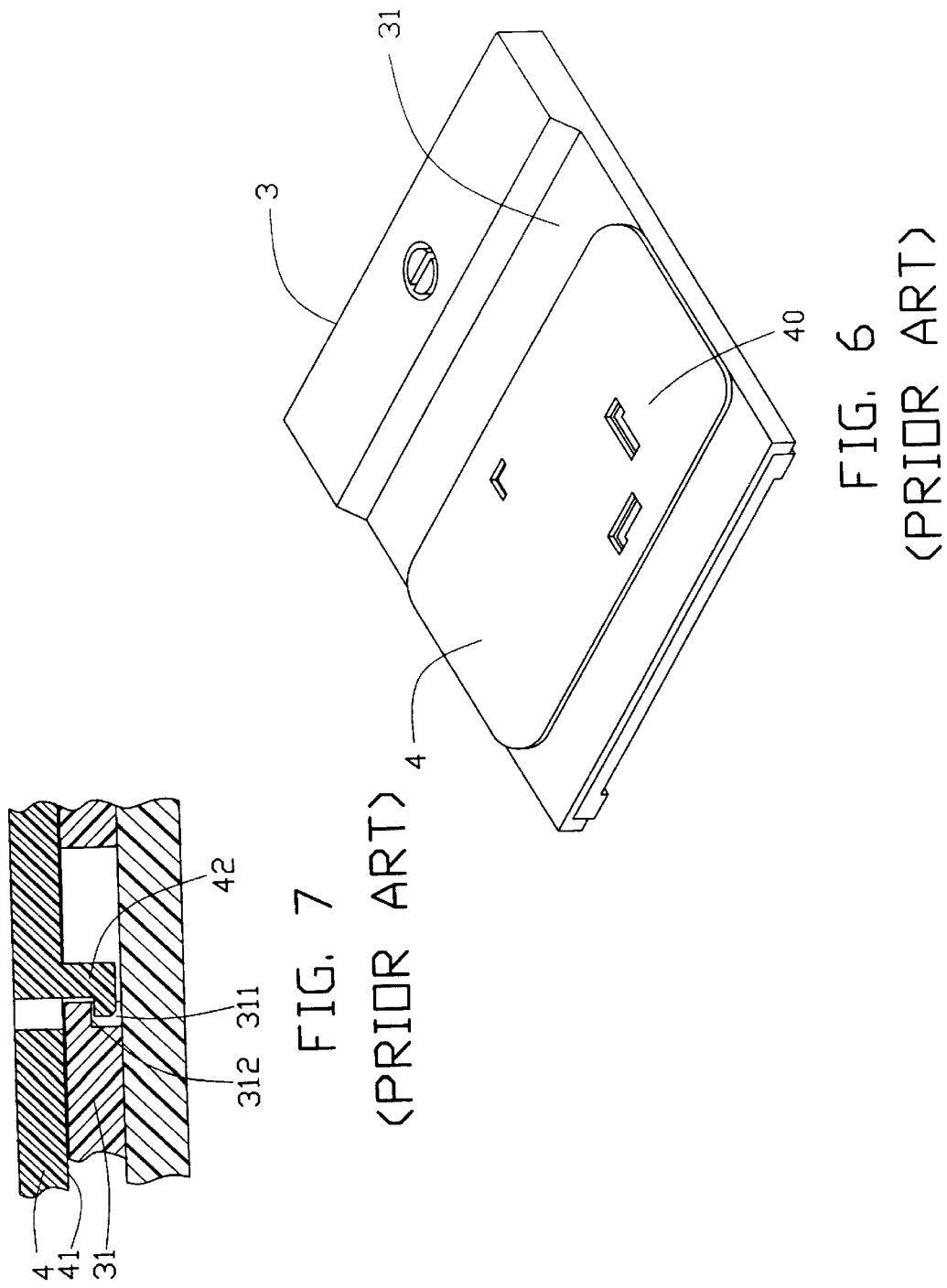
FIG. 6 is a perspective view of a pick-up cap according to prior art and a CPU socket.
FIG. 7 is a partially cross-sectional view of the pick-up cap and the CPU socket of FIG. 6, showing positional relationship of the cap and the socket.

Referring particularly to FIGS. 3 and 4, when the driving cam 13 is moved to an open position, the pick-up cap 2 is assembled to the socket 1 with the legs 23 being inserted into the openings 112 and 121 with zero insertion force (ZIF). At this position, the connecting arm 231 of the leg 23 is received in the opening 121 and the hook 232 is received in the opening 232. Referring to FIG. 5, when the driving arm 13 is at its closed position, the cover 11 slides laterally with regard to the base 12 such that the opening 112 and the opening 121 are partially overlapped with each other. At this position, part of a side wall 110 of the cover 11 extends beyond the opening 121 and prevents the legs 23 from disconnection by stopping the hook 232 with a bottom surface of the side wall 110.

In assembly, the opening 112 of the cover 11 is firstly overlapped the opening 121 of the base 12 completely, then the hook 232 is inserted through the opening 112 and received in the opening 121. Subsequently, the cover 11 slides laterally with regard to the base 12 to make the opening 112 partially overlap the opening 121, so that the opening 112 of the cover 11 engages with the hook 232. Finally, a vacuum device (not shown) sucks the pick-up cap 2 to mount the socket 1 at a predetermined position on the PCB.

It is to be understood, however, that even though numerous characteristics and advantages of the present invention have been set forth in the foregoing description, together with details of the structure and function be of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket assembly comprising:
   a base defining at least one first opening thereof;
   a cover slidably stacked on the base and defining at least one second opening alignable with the at least one first opening;
   a pick-up cap mounted onto the cover, the pick-up cap comprising at least one leg having a hook at a free end thereof, the hook freely extending through the at least one second opening and the at least one first opening when the cover is in an open position, and the hook being latchably engaged with the cover when the cover is in a closed position, wherein
      said base and said cover together defines a central opening, and said first and second openings are located about a periphery of said central opening.

2. The socket assembly as described in claim 1, wherein the pick-up cap comprises a flat top surface and a bottom surface, and the leg comprises a connecting arm extending downwardly from the bottom surface, the hook being bent vertically at a free end of the connecting arm.

3. The socket assembly as described in claim 2, wherein the connecting arm is received in the second opening, and the hook is received in the first opening.

4. A method of mounting a pick-up cap to a CPU socket, comprising steps of:
   providing a socket with a base having at least one opening and a cover slidably stacked on the base having at least another opening alignable with the at least one opening of the base;
   forming a central opening in both said base and said cover;
   locating said at least one opening and said at least another opening located on a periphery of said central opening;
   providing a pick-up cap having at least one leg having a hook at a free end thereof;
   mounting the pick-up cap onto the socket with the hook of the at least one leg freely extending through the at least one opening of the cover and being received in the at least another opening of the base;
   moving the cover relative to the base to engage with the hook of the at least one leg thereby securing the pick-up cap on the socket.

5. A socket assembly comprising:
   a stationary base with contact areas thereof;
   a cover moveable relative to the base along a front-to-back direction, said cover defining a plurality of through holes in vertical alignment with said contact areas for receiving corresponding CPU pins;
   said base and said cover commonly defining a central opening surrounded by said contact areas and said through holes; and
   a pick-up cap mounted on the cover and defining a flat top surface and a pair of downwardly extending legs located around two opposite diagonal corners of said central opening; wherein
      said pair of legs is latchably engaged with the cover in a vertical direction perpendicular to said front-to-back direction when said cover is located in a first position relative to the base for fastening the pick-up cap to the cover, while is disengaged from the cover in said vertical direction when said cover is moved to a second position relative to the base along said front-to-back direction.

* * * * *